United States Patent
Kobayashi et al.

(10) Patent No.: US 6,538,285 B2
(45) Date of Patent: Mar. 25, 2003

(54) SILICON WAFER

(75) Inventors: Norihiro Kobayashi, Annaka (JP); Shoji Akiyama, Annaka (JP); Takao Abe, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/983,205

(22) Filed: Oct. 23, 2001

(65) Prior Publication Data
US 2002/0070427 A1 Jun. 13, 2002

Related U.S. Application Data

(62) Division of application No. 09/600,819, filed as application No. PCT/JP99/06732 on Dec. 1, 1999, now Pat. No. 6,333,279.

(51) Int. Cl.$^7$ ................ H01L 27/01; H01L 27/12; H01L 31/0392
(52) U.S. Cl. .................. 257/347; 257/617
(58) Field of Search ................ 257/347, 459, 257/460, 617, 758, 798

(56) References Cited

U.S. PATENT DOCUMENTS

| | | | |
|---|---|---|---|
| 5,665,202 A | 9/1997 | Subramanian et al. | 438/692 |
| 5,738,942 A | 4/1998 | Kubota et al. | 428/428 |
| 5,788,763 A * | 8/1998 | Hayashi et al. | 438/146 |
| 6,086,679 A | 7/2000 | Lee et al. | 118/724 |
| 6,189,546 B1 | 2/2001 | Zhang et al. | 134/1.3 |
| 6,333,279 B1 * | 12/2001 | Kobayashi et al. | 438/800 |

FOREIGN PATENT DOCUMENTS

| | | |
|---|---|---|
| EP | 0 955 671 A1 | 11/1999 |
| JP | A-07-235534D | 9/1995 |
| JP | A-10-326790 | 12/1998 |

\* cited by examiner

*Primary Examiner*—David Nelms
*Assistant Examiner*—David Nhu
(74) *Attorney, Agent, or Firm*—Oliff & Berridge, PLC

(57) ABSTRACT

The present invention provides a method for producing a silicon wafer characterized in that at least one surface of the wafer is subjected to a multi-step polishing process, in which a heat treatment in a mixed gas atmosphere of hydrogen and argon through use of a rapid heating/rapid cooling apparatus is substituted for a final polishing in the multi-step polishing process, and a silicon wafer produced by the method. Thereby, there can be provided a silicon wafer in high productivity wherein there is neither mechanical damages nor scratches on the surface of the wafer, surface roughness is significantly improved, and there is no slip dislocation.

1 Claim, 1 Drawing Sheet

SILICON WAFER

This is a Division of application Ser. No. 09/600,819 filed Jul. 24, 2000, now U.S. Pat. No. 6,333,279 which in turn is a National Stage of PCT/JP99/06732 filed Dec. 1, 1999. The entire disclosure of the prior application(s) is hereby incorporated by reference herein in its entirety.

FIELD OF THE INVENTION

The present invention relates to a method for producing a silicon wafer wherein there is no mechanical damage, surface roughness is small and there is no slip dislocation.

DESCRIPTION OF THE RELATED ART

Recently, a silicon single crystal wafer is mainly used as a wafer for fabricating a device such as a semiconductor integrated circuit or the like. In the device such as a semiconductor integrated circuit or the like, a design rule of the device recently tends to get smaller. Accordingly, some problems that previously had not mattered so much have been getting serious and important. Examples of those problems include mechanical damages, scratches and micro roughness introduced in a step of processing a wafer. It has been getting more important especially nowadays to remove the mechanical damages or the like, to provide a wafer having good flatness.

Because, the mechanical damages, scratches and micro roughness will be serious problems in a process for fabricating a device, especially in a process for fabricating a recent device having a small design rule and being highly integrated. For example, the mechanical damages, scratches or the like on the surface of the wafer cause local diffusion abnormality in a process of diffusion or ion plantation that is a process for incorporating impurities, and cause local oxidation abnormality in an oxidation process. They cause life time of the wafer to be shorter. Such a harmful influence due to mechanical damages or the like gets larger in higher integrated device.

Conventionally, in manufacture of a semiconductor silicon wafer, crystal defects such as mechanical damages or the like have been introduced in the wafer in various processes of processing a silicon single crystal to be a wafer, and the wafer has been used in a process for fabricating a device, without removing the mechanical damages or the like. Such mechanical damages or the like are often introduced, especially in a polishing process.

Namely, a polishing process generally conducted in production of a silicon wafer is a multi-step polishing process comprising a combination of chemical etching and mechanical polishing. Such a multi-step polishing process comprises, for example, processes called in order first polishing, second polishing, (third polishing, if desired), final polishing. Polishing conditions are varied in each of the steps, for example, abrasive grains having smaller grain size or a polishing pad having lower hardness is used in the later step.

In that case, since higher flatness is required in the surface of the wafer finally obtained, it was necessary to conduct polishing wherein mechanical character is enhanced (mechanically enhanced polishing) at least in the final step of the polishing process (final polishing) to make micro roughness of the finished surface small. Accordingly, the wafer is stressed much by the mechanically enhanced polishing, so that scratches and slight mechanical damages may remain on the surface. If polishing wherein chemical character is enhanced (chemically enhanced polishing) such as a second polishing is mainly conducted, almost no mechanical damages remain, but flatness of the surface is degraded resulting in large micro roughness.

Such problems cannot be avoided, in the case that mechanical polishing and chemical etching are combined in a polishing process. It is impossible to make the micro roughness small enough and prevent introduction of mechanical damages in the processing method according to conventional polishing methods.

In order to overcome disadvantages of the conventional methods for polishing a wafer, there has been disclosed in Japanese Patent Application Laid-open (Kokai) No.7-235534, a technique for substituting heat treatment in a hydrogen gas atmosphere for the final polishing step in a method for producing a silicon wafer, which uses a phenomena that the surface of the silicon wafer is etched by heat treatment in a hydrogen gas atmosphere.

In such a technology, the wafer obtained in the polishing step before the final polishing is subjected to the heat treatment in a hydrogen atmosphere without conducting a final polishing, and the same degree of surface roughness as that may be obtained in the final polishing can be obtained by the above-mentioned etching effect. Such a method seems to have an effect of enabling high flatness of the surface without introducing the mechanical damages caused by the mechanically enhanced polishing, since the intended surface roughness can be achieved even when the final polishing process is omitted. In such a method, it is necessary to conduct the heat treatment in a hydrogen atmosphere at a temperature of 1200° C. or more for a period from 30 minutes to four hours.

According to the above-mentioned method, removal of mechanical damages and scratches, and lowering of micro roughness are possibly achieved at the same time. However, there is a disadvantage that slip dislocation is easily generated in the wafer during the heat treatment in the method. Such a problem is serious, especially when a wafer having a large diameter is subjected to the heat treatment. Since a wafer has been getting larger recently, such a disadvantage is a serious problem. Furthermore, since an etching effect on the surface is used in the above method, there is a problem that thickness of the wafer is inevitably changed before and after the heat treatment.

The heat treatment at high temperature of 1200° C. or more for a long time has also a disadvantage that productivity is lowered, since it also needs a long time for raising and lowering temperature, as a result, longer time is required for the whole heat treatment process.

As described above, there is no conventional method for producing a silicon wafer wherein mechanical damages are not introduced on the surface of the wafer, micro roughness is sufficiently controlled to improve surface roughness, and slip dislocation is not introduced, and productivity is high. Therefore, development of a substitute for the conventional methods has been required.

BRIEF SUMMARY OF THE INVENTION

The present invention has been accomplished to solve the above-mentioned problems. An object of the present invention is to provide a method for producing a silicon wafer that can produce in high productivity a silicon wafer wherein there is neither mechanical damages nor scratches on the surface of the wafer, surface roughness is significantly improved, and there is no slip dislocation.

To achieve the above mentioned object, the present invention provides a method for producing a silicon wafer wherein at least one surface of the wafer is subjected to a multi-step polishing process, in which a heat treatment in a mixed gas atmosphere of hydrogen and argon through use of a rapid heating/rapid cooling apparatus is substituted for a final polishing in the multi-step polishing process.

As described above, if the heat treatment in a mixed gas atmosphere of hydrogen and argon through use of a rapid heating/rapid cooling apparatus is substituted for a final polishing, mechanically enhanced polishing as a final polishing step can be omitted, so that there can be provided a wafer wherein mechanical damages are not introduced on the surface of the wafer, and surface roughness is sufficiently improved by the rapid thermal annealing. Furthermore, since the wafer is subjected to the heat treatment in a mixed gas atmosphere of hydrogen and argon, slip dislocation can also be prevented from generating in the wafer. Since the heat treatment is conducted through use of a rapid heating/rapid cooling apparatus, the heat treatment is not necessary to be conducted for a long time, so that a silicon wafer can be produced in high productivity.

In that case, a ratio of hydrogen gas to a mixed gas of hydrogen and argon is preferably 20 to 40% by volume.

Because, if a ratio of hydrogen gas to a mixed gas of hydrogen and argon as an atmosphere for the heat treatment is 20 to 40% by volume, especially, generation of slip dislocation can be prevented almost completely.

The above-mentioned heat treatment is preferably conducted at a temperature of 1100 to 1300° C. for 1 to 60 seconds.

Because, if the heat treatment is conducted at a temperature of 1100° C. or more, surface roughness on the surface of the wafer can be improved more effectively. If the heat treatment is conducted at a temperature of 1300° C. or less, generation of slip dislocation can be prevented more effectively. If the heat treatment is conducted for one second or more, surface roughness on the surface of the wafer can be improved effectively, and 60 seconds will be enough to obtain such an effect. If the heat treatment is conducted for 60 seconds or less, the silicon wafer can be produced in significantly high productivity.

Furthermore, the silicon wafer produced according to the method of the present invention is, for example, a silicon wafer wherein mechanical damage is 12.5 pm (pico meter) or less as PAD value, the surface roughness is 1.0 nm or less as P–V value (the maximum difference between peek and valley) in 2 by 2 $\mu$m square measured with an atomic force microscope, and there is no slip dislocation.

As described above, the silicon wafer of the present invention is the wafer containing substantially no mechanical damages, and having excellent surface roughness and having no slip dislocation. Accordingly, it can be used for a semiconductor device or the like that will have a small design rule and be highly integrated in future.

PAD (Photo-Acoustic Displacement) value herein means an amount of variation of photothermal effect resulting from increase of diffusion temperature due to heat converted from light absorbed on the surface when the surface of the wafer is exposed to exciting light. Evaluation of the value enables accurate evaluation of mechanical damages of the wafer.

As described above, according to the method for producing a silicon wafer of the present invention, there can be produced in high productivity the wafer wherein there is no mechanical damages nor scratches on the surface of the wafer, the surface roughness is extremely improved, there is no slip dislocation. Subsidiary effects of the present invention are that the process can be simplified by omitting the polishing step to be finally conducted, and that COPs can be reduced.

BEST MODE FOR CARRYING OUT THE INVENTION

Figure 1:
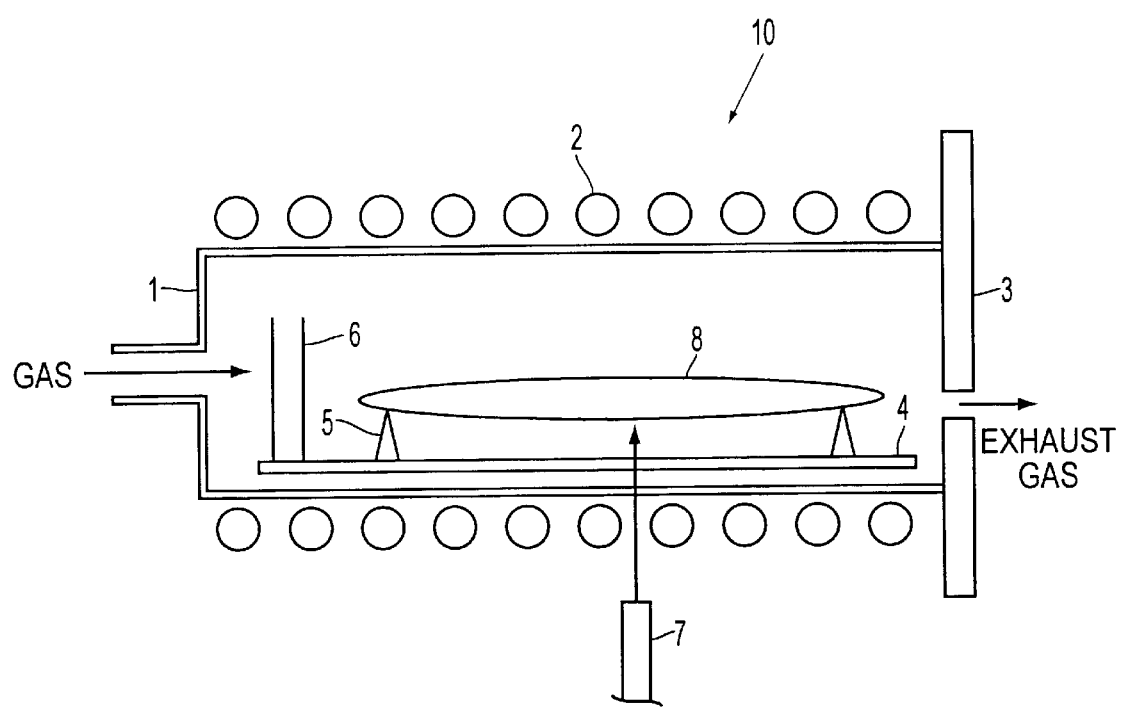
FIG. 1 is a schematic view showing one example of an apparatus for rapid heating/rapid cooling of a silicon wafer.

The present invention will be further described below in detail.

The inventors have found that a silicon wafer wherein there is no substantial mechanical damage, surface roughness is good and there is no slip dislocation can be produced in high productivity by substituting heat treatment in a mixed gas atmosphere of hydrogen and argon using a rapid heating/rapid cooling apparatus for the final polishing in a polishing process in production of a silicon wafer, to complete the present invention.

In a conventional multi-step polishing process wherein chemical etching and mechanical polishing are combined, there is a problem that both removal of mechanical damages on the surface of the wafer and improvement of surface roughness cannot be achieved. Accordingly, there was proposed in Japanese Patent Application Laid-open (Kokai) No. 7-235534, a method of substituting heat treatment at high temperature for a long time in a hydrogen gas atmosphere for a mechanically enhanced polishing as a final polishing step, to remove mechanical damages and improve surface roughness.

However, as described above, there is a disadvantage that slip dislocation is generated in the wafer due to the heat treatment in an atmosphere of hydrogen gas at high temperature for a long time, which may lead to low productivity.

Since the heat treatment in an atmosphere of hydrogen gas as disclosed in Japanese Patent Application Laid-open (Kokai) No. 7-235534 uses a phenomena that the surface of the silicon wafer is etched by a hydrogen atmosphere, it takes long time to make the wafer flat. Accordingly, slip dislocation is easily generated in the wafer, and there is also a problem that a thickness of the wafer is decreased, since the surface of the wafer is etched.

In the method of the present invention, the heat treatment in a mixed gas atmosphere of hydrogen and argon at high temperature for a short time is conducted using a rapid heating/rapid cooling apparatus. This method is similar to the method disclosed in Japanese Patent Application Laid-open (Kokai) No. 7-235534 at the point that the wafer is subjected to heat treatment instead of the final polishing, but is entirely different therefrom in the principle.

The method of the present invention utilizes migration due to heat treatment at high temperature for a short time using a rapid heating/rapid cooling apparatus. Namely, the heat treatment in a mixed gas atmosphere of hydrogen and argon at high temperature for a short time accelerate migration and rearrangement of silicon atoms on the surface of the silicon wafer. As a result, micro roughness on the surface of the wafer is made flat by the migration and rearrangement of the atoms on the surface of the wafer, so that surface roughness of the wafer can be extremely improved.

According to the method, since the surface of the wafer is not etched, heat treatment time can be short, so that slip dislocation is not generated, and thickness of the wafer is not decreased. Accordingly, micro flatness on the surface can be surely achieved without introducing mechanical damages. Furthermore, the macro flatness is not degraded.

The inventors have further studied the heat treatment conditions that enable removal of mechanical damages and micro roughness on the surface of the silicon wafer, and sure prevention of generation of slip dislocation by making experiments, and found that a silicon wafer having small surface roughness and having no slip dislocation can be obtained by conducting heat treatment not in an atmosphere of 100% hydrogen gas as conducted conventionally, but in a mixed gas atmosphere of hydrogen and argon.

In an atmosphere of 100% hydrogen gas, since cooling effect of hydrogen gas is too strong, uniformity of temperature distribution on the surface of the wafer is degraded, stress is generated, which may cause slip. Accordingly, the inventors tried to add argon gas that is inactive, highly safe, and easy to be treated to the atmosphere, and found that the cooling effect is reduced, generation of slip dislocation is significantly suppressed compared to the case that an atmosphere of 100% hydrogen is used. Furthermore, the inventors found that the effect of improving surface roughness of the wafer is lowered when an atmosphere of 100% argon gas is used, and found that it is preferable to use a mixed gas of hydrogen and argon as an atmosphere for the heat treatment.

Moreover, the inventors studied optimal composition of the atmosphere, and found that the effect of improving surface roughness of the wafer is especially large and generation of slip dislocation can be prevented almost completely when 20–40% by volume of hydrogen is contained in the mixed gas atmosphere of hydrogen and argon.

The inventors also studied heat treatment temperature and heat treatment time, and found that heat treatment temperature of 1100° C. or higher at which migration of silicon atoms on the surface of the silicon wafer is easily caused is preferable to remove micro roughness, and heat treatment temperature of 1300° C. or less is preferable to prevent generation of slip dislocation.

It was found that when heat treatment time is one second or more, migration on the surface of the silicon wafer is easily caused, and thus the silicon wafer especially having small surface roughness can be obtained. It was also found that heat treatment time of 60 seconds was sufficient for the improvement effect, and if the heat treatment time was more than 60 seconds, productivity of the silicon wafer was lowered. Accordingly, the heat treatment time is preferably 60 second or less.

According to the method of the present invention, there can be produced in high productivity the silicon wafer wherein there is no substantial mechanical damages, surface roughness is excellent, and there is no slip dislocation. Subsidiary effects of the present invention are that the process can be simplified by omitting the polishing step to be finally conducted, and that crystal defects having regular octahedral structure called COPs (Crystal Originated Particle) that are introduced during growth of the crystal can be reduced. Accordingly, there can be found that there can be produced the silicon wafer that are excellent in electronic characteristics such as oxide dielectric breakdown voltage or the like.

The present invention will be further described below in detail, but is not limited thereto.

An example of a rapid heating/rapid cooling apparatus used for the silicon wafer to be used in the present invention is an apparatus such as a lamp heater with heat radiation. An example of commercially available apparatuses is SHS-2800 (manufactured by Steag Microtech International Corporation). These apparatuses are neither extremely complicated nor expensive.

An example of rapid heating/rapid cooling apparatus (RTA apparatus) used for a silicon single crystal wafer in the present invention will be shown hereunder. FIG. 1 is schematic view of RTA apparatus.

A heat-treatment apparatus 10 shown in FIG. 1 includes a chamber 1 made of quarts and in which a wafer is subjected to heat treatment. Heating is conducted with heat lamps 2 surrounding the chamber 1 on its up and down side and right and left side. Power supplied to each of the lamps can be controlled independently.

An automatic shutter 3 is provided on the side of gas exhaust in order to shut out outside atmosphere. An unillustrated wafer port that is opened and closed by means of a gate valve is provided at the automatic shutter 3. A gas outlet is provided at the automatic shutter 3 so that the gas atmosphere within the furnace can be adjusted.

A wafer 8 is placed on a three-point supporting part 5 formed on a quartz tray 4. A buffer 6 made of quartz is provided on the side of a gas inlet of the tray 4 in order to prevent an introduced gas from directly being in contact with the wafer.

The chamber 1 also has an unillustrated special window for measuring temperature, so that temperature of the wafer 8 can be measured through the special window using a pyrometer 7 provided outside of the chamber 1.

The rapid heating/rapid cooling treatment of the wafer with the above-mentioned heat treatment apparatus 10 is conducted as follows.

The wafer 8 is inserted into the chamber 1 through the wafer port by an unillustrated wafer handling apparatus arranged next to the heat treatment apparatus 10, and placed on the tray 4. Then, the automatic shutter 3 is closed.

The wafer 8 is heated to a desired temperature, for example, at 1100–1300° C. by supplying power to the lamp heaters 2. It takes, for example, about 20 seconds to achieve the desired temperature. Then, the tempertaure is maintained for a certain time to subject the wafer 8 to the high-temperature heat treatment. Upon elapse of the predetermined time to complete high-temperature heat treatment, the temperature of the wafer is lowered by decreasing power supply of the lamp. It also takes, for example, about 20 seconds to decrease the temperature. Finally, the wafer is unloaded from inside the chamber by the wafer handling apparatus, thus completing the heat treatment.

EXAMPLE

The following example and comparative examples are being submitted to further explain the present invention. These examples are not intended to limit the scope of the present invention.

Example

A p-type single crystal silicon ingot grown by Czochralski method having a <100> crystal orientation, a diameter of 8 inches, about 10 Ω·cm, oxygen concentration of 16 ppma (JEIDA) was sliced to provide a wafer. The surface of the wafer was subjected to the first polishing (mechanically enhanced polishing), the second polishing (chemically enhanced polishing), and a heat treatment of the present invention in place of the final polishing (mechanically enhanced polishing) generally conducted finally, so as to be a mirror surface. Thereby, the silicon wafer can be produced. Mechanical damages, surface roughness and slip dislocation of the produced silicon wafer were measured and evaluated.

As a rapid heating/rapid cooling apparatus for the heat treatment, SHS-2800 manufactured by AST Corporation was used. The heat treatment was rapid heating/rapid cooling conducted in a mixed gas atmosphere of 30% by volume of hydrogen gas and 70% by volume of argon gas at 1200° C. for 10 seconds.

Evaluation of mechanical damages was conducted by measuring PAD value of the wafer using a wafer damage monitor PA 300 manufactured by Kobe Steel, LTD. Generally, mechanical damage of the wafer finished by a final polishing is large as about 13.0 pm as PAD value. However, PAD value of the wafer produced omitting a final polishing (conducting no mechanically enhanced polishing but only chemically enhanced polishing) is generally 12.4 pm to 12.5 pm. Accordingly, if the measured value is 12.5 pm or less, it can be evaluated that there is substantially no mechanical damage.

Evaluation of surface roughness was conducted by measuring P–V value in the region of 2×2 μm with an atomic force microscope Nano Scope-2 manufactured by Digital Instrument Corporation. The P–V value thus measured was used for evaluation of surface roughness. According to the conventional method, the value is 1.1 nm or more.

Slip dislocation was evaluated by measuring a length of all slip dislocation generated after the heat treatment, and summing the value.

The results obtained by the above methods were shown in Table 1.

TABLE 1

|  | Example | Comparative Example 1 | Comparative Example 2 |
|---|---|---|---|
| Mirror polishing | Only first polishing + second polishing | First polishing + second polishing + final polishing | Only first polishing + second polishing |
| Heat treatment | RTA 1200° C., 10 sec | No | Resistance heating, 1200° C., 60 min |
| Atmosphere (volume ratio) | 30% hydrogen, 70% argon | No | 100% Hydrogen |
| Mechanical damage (pm) | 12.48 | 13.03 | 12.46 |
| Surface roughness (nm) | 0.82 | 1.13 | 0.73 |
| Slip dislocation (mm) | 0 | 0 | 62 |

As shown in Table 1, since mechanically enhanced polishing as a final polishing is not conducted in the method of the present invention, the silicon wafer produced according to the method has mechanical damage of 12.48 pm, namely not more than 12.5 pm as PAD value, which means substantially no mechanical damage. Surface roughness thereof is 0.82 nm as P–V value, which is significantly improved compared with the conventional wafer. No slip dislocation was found in the wafer.

Comparative Example 1

A wafer was produced by slicing the same silicon single crystal ingot as one produced in the Example. It is subjected to, as mirror polishing, the first polishing (mechanically enhanced polishing), the second polishing (chemically enhanced polishing), the final polishing (mechanically enhanced polishing) generally conducted as the final step, to produce a silicon wafer. According to the same method as Example, mechanical damages, surface roughness and slip dislocation of the produced silicon wafer were measured and evaluated.

The results were shown in Table 1.

As shown in Table 1, since the silicon wafer produced in Comparative Example 1 is not subjected to heat treatment in hydrogen atmosphere, slip dislocation is not generated in the silicon wafer. However, since the wafer is subjected to mechanical polishing as a final polishing, mechanical damage as PAD value was large as 13.03 pm. Furthermore, surface roughness was 1.13 nm, that was large compared with the silicon wafer of Example.

Comparative Example 2

A wafer was produced by slicing the same silicon single crystal ingot as one produced in the Example. It is subjected to, as mirror polishing, the first polishing (mechanically enhanced polishing), the second polishing (chemically enhanced polishing), and a heat treatment in 100% hydrogen atmosphere at 1200° C. for 60 minutes using a resistance heating furnace in place of the final polishing (mechanically enhanced polishing) generally conducted as a final step, to produce a silicon wafer. According to the same method as Example, mechanical damages, surface roughness and slip dislocation of the produced silicon wafer were measured and evaluated.

The results were shown in Table 1.

As shown in Table 1, in the silicon wafer produced in Comparative Example 2, mechanical damages and surface roughness were improved as the silicon wafer of the Example, but a lot of slip dislocation was generated, namely general improvement of quality of the silicon wafer was not achieved. Furthermore, the method of Comparative Example 2 needs a long heat treatment time as 60 minutes, and therefore, productivity of the wafer is quite low.

The present invention is not limited to the above-described embodiment. The above-described embodiment is a mere example, and those having the substantially same structure as that described in the appended claims and providing the similar action and effects are included in the scope of the present invention.

For example, in the above-described embodiment, a heat treatment apparatus as shown in FIG. 1 is used. However, the present invention is not limited thereto. In principle, any apparatus may be used for the prevent invention so long as it can heat and cool a silicon wafer rapidly.

Furthermore, in the above embodiment, there was explained the case where the silicon single crystal ingot having a diameter of 8 inches was produced. However, the method of the present invention can sufficiently cope with a silicon single crystal ingot having any diameter, for example a diameter of 10 to 16 inches, or more.

Moreover, there was explained the case where polishing steps conducted before the heat treatment with a rapid heating/rapid cooling apparatus were the first polishing (mechanically enhanced polishing) and the second polishing (chemically enhanced polishing). However, the present invention is not limited thereto. Effect of the present invention can be achieved in the case that multi-step polishing is conducted, whether each polishing step is mechanically enhanced polishing or chemically enhanced polishing.

As a matter of course, the present invention can be applied not only to a polishing step wherein one side of a silicon wafer is polished, but also to a polishing step wherein both sides of a silicon wafer are polished.

What is claimed is:
1. A silicon wafer, having:
    a mechanical damage characterized by a PAD value of 12.5 pm or less;
    a surface roughness characterized by a P–V value of 1.0 nm or less; and
    wherein the silicon wafer has no slip dislocation.

* * * * *